(12) United States Patent
Perkins

(10) Patent No.: US 7,486,535 B2
(45) Date of Patent: Feb. 3, 2009

(54) METHOD AND DEVICE FOR PROGRAMMING ANTI-FUSES

(75) Inventor: Geoffrey W. Perkins, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/692,332

(22) Filed: Mar. 28, 2007

(65) Prior Publication Data

US 2008/0237788 A1    Oct. 2, 2008

(51) Int. Cl.
    G11C 11/00 (2006.01)
(52) U.S. Cl. ........................................ 365/96; 365/195
(58) Field of Classification Search ................... 365/96, 365/195
    See application file for complete search history.

(56) References Cited

U.S. PATENT DOCUMENTS

| | | | |
|---|---|---|---|
| 5,257,222 A | 10/1993 | Lee | |
| 5,841,723 A | 11/1998 | Ma | |
| 5,978,298 A | 11/1999 | Zheng | |
| 6,335,892 B1 | 1/2002 | Shirley | |
| 6,351,425 B1 | 2/2002 | Porter | |
| 6,469,923 B1* | 10/2002 | Hidaka | ........................ 365/149 |
| 6,741,117 B2 | 5/2004 | Lee | |
| 6,751,150 B2* | 6/2004 | Marr et al. | ................ 365/225.7 |
| 7,253,496 B2* | 8/2007 | Jenne et al. | .................. 257/530 |
| 2004/0065941 A1 | 4/2004 | Marr | |
| 2006/0291315 A1 | 12/2006 | Andre et al. | |

OTHER PUBLICATIONS

Cha, Hyouk-Kyu et al,; "A 32-KB Standard CMOS Antifuse One-Time Programmable ROM Embedded in a 16-bit Microcontroller"; IEEE Journal of S0lid-State Circuits; Sep. 2006; pp. 2115-2124; vol. 41, No. 9; IEEE.
International Search Report and Written Opinion, Jun. 27, 2008.

* cited by examiner

*Primary Examiner*—Michael T Tran

(57) ABSTRACT

A device includes an anti-fuse including a first electrode that can be selectively coupled to a first voltage reference and a second electrode that can be selectively coupled to a second voltage reference. The device further includes a shunt transistor including a first current electrode coupled to the first electrode of the anti-fuse, a second current electrode coupled to the second electrode of the anti-fuse, and a control electrode. The device additionally includes control logic configured to disable the shunt transistor in response to a first program operation intended for the anti-fuse. The control logic also is configured to enable the shunt transistor in response to a second program operation not intended for the anti-fuse.

18 Claims, 4 Drawing Sheets

US 7,486,535 B2

METHOD AND DEVICE FOR PROGRAMMING ANTI-FUSES

FIELD OF THE DISCLOSURE

The present disclosure relates generally to programming anti-fuses and more particularly to protecting against inadvertent programming of anti-fuses.

BACKGROUND

Anti-fuses often are utilized to customize functionality of an integrated circuit device (e.g., by setting a particular mode or trimming an output), reroute circuitry around a defective element, or as backup elements to improve production yield. Anti-fuses, when programmed or "blown," change from a high resistance state to a low resistance state. An oxide layer having a low breakdown voltage between conducting layers conventionally is used to implement an anti-fuse. Upon application of a program voltage between the conducting layers that is higher than the oxide breakdown voltage, oxide rupture occurs at the oxide layer, thereby creating a conductive path between the conductive layers and thus changing the anti-fuse to a low resistance state.

Due to the limited range of program voltages that can be applied to an integrated circuit, it typically is desirable to utilize the thinnest type of oxide for a particular IC fabrication process that is available and the oxide type is selected so that the oxide breakdown voltage is lower than the maximum voltage that the devices in the IC fabrication process can endure. However, due to relatively thin oxide layers with relatively low oxide breakdown voltages, anti-fuses typically are fragile and may blow when a proximate anti-fuse is being programmed due to parasitic capacitance coupling between the anti-fuses.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
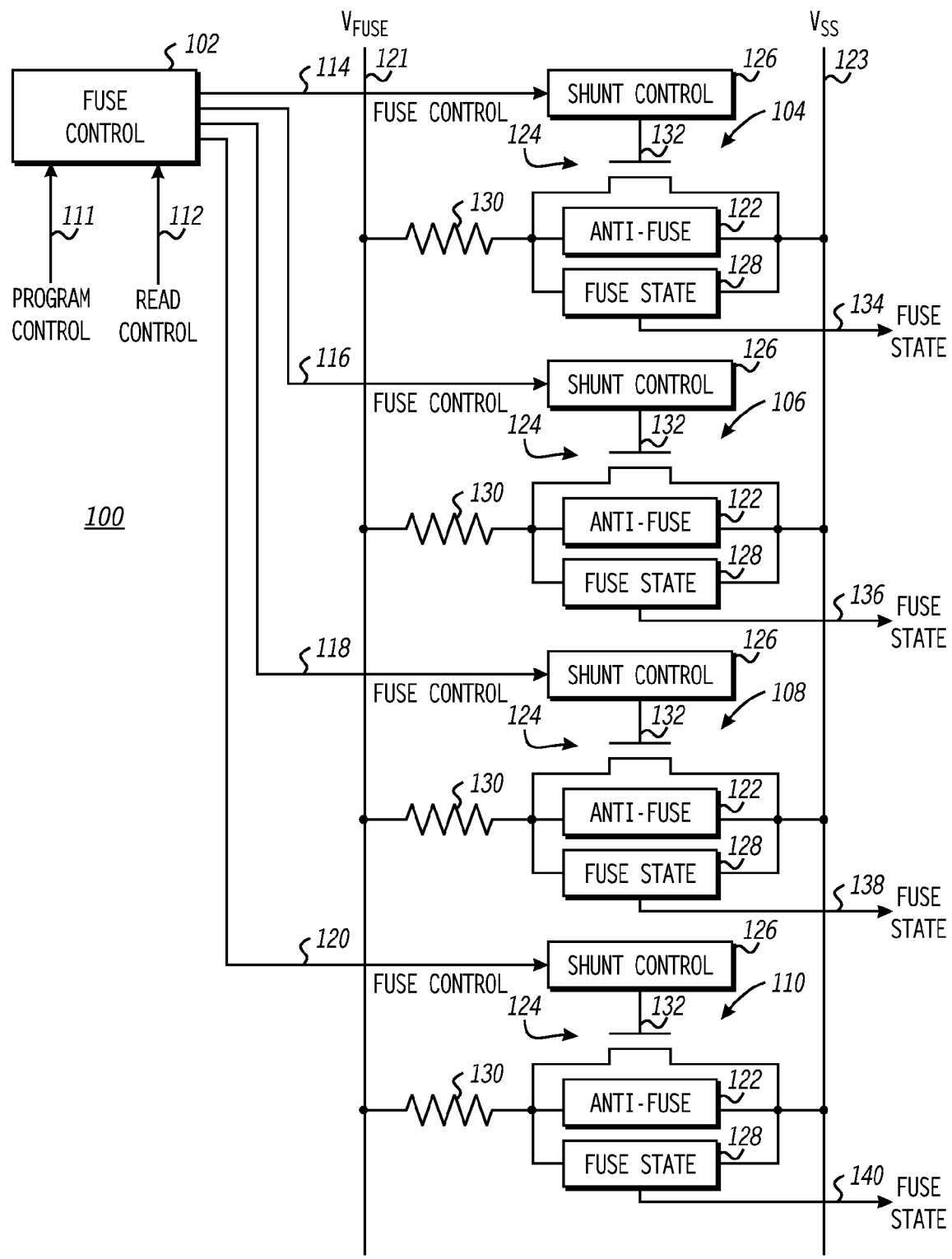
FIG. 1 is a block diagram illustrating an anti-fuse array in accordance with one embodiment of the present disclosure.

In accordance with one aspect of the present disclosure, a method includes disabling a shunt transistor coupled in parallel with an anti-fuse in response to initiation of a first program operation intended for the first anti-fuse. The method further includes enabling the shunt transistor in response to initiation of a second program operation not intended for the anti-fuse.

In accordance with another aspect of the present disclosure, a device includes an anti-fuse including a first electrode coupleable to a first voltage reference and a second electrode coupleable to a second voltage reference. The device further includes a shunt transistor including a first current electrode coupled to the first electrode of the anti-fuse, a second current electrode coupled to the second electrode of the anti-fuse, and a control electrode. The device additionally includes control logic configured to disable the shunt transistor in response to a first program operation intended for the anti-fuse. The control logic also can be configured to enable the shunt transistor in response to a second program operation not intended for the anti-fuse.

In accordance with yet another aspect of the present disclosure, a device includes an array of anti-fuse cells, each anti-fuse cell including an anti-fuse and a shunt transistor coupled in parallel. The device further includes a fuse control module configured to disable a first shunt transistor of a first anti-fuse cell of the array in response to a program operation and enable a second shunt transistor of a second anti-fuse cell of the array in response to the program operation. The program operation is intended for the first anti-fuse cell and not intended for the second anti-fuse cell.

FIGS. 1-5 illustrate example techniques for programming anti-fuses while reducing or eliminating the risk of inadvertently programming proximate anti-fuses. In at least one embodiment, some or all of the anti-fuse cells of an array each includes an anti-fuse and a shunt transistor coupled in parallel, whereby the shunt transistor is selectively enabled or disabled to permit programming of the anti-fuse while protecting against inadvertent programming of the anti-fuse while another anti-fuse cell is being programmed. In response to initiation of a program operation intended for the anti-fuse (i.e., a program operation intended to program the anti-fuse), the shunt transistor is disabled, thereby making the shunt transistor an open circuit between its current electrodes. Accordingly, a program voltage can be applied to the anti-fuse to cause it to blow without significant current draw by the disabled shunt transistor. Conversely, in response to initiation of a program operation not intended for the anti-fuse (i.e., a program operation whereby the anti-fuse is intended to remain unprogrammed), the shunt transistor is enabled so that the shunt transistor effectively is a short circuit between its current electrodes, thereby allowing any errant current caused by parasitic capacitive coupling with the proximate anti-fuse to be shunted around the anti-fuse through the shunt transistor and thus reducing or eliminating the potential for inadvertent programming of the anti-fuse.

Further, in at least one embodiment, the parallel shunt transistors can be used to selectively program the anti-fuses of an array of anti-fuses. The anti-fuses of the array each can be coupled between two voltage reference lines, whereby a program voltage is applied across the two voltage reference lines. For those anti-fuses intended to be programmed, the associated shunt transistors can be disabled, thereby driving programming currents through the associated anti-fuses. For those anti-fuses intended to remain unprogrammed, the associated shunt transistors can be enabled, thereby shunting any currents caused by the application of the program voltage through the shunt transistor and around the associated anti-fuses.

FIG. 1 illustrates an example anti-fuse array 100 of an integrated circuit (IC) device in accordance with at least one embodiment of the present disclosure. The anti-fuse array 100 includes a fuse control module 102 and a block or set of anti-fuse cells controlled by the fuse control module 102. In the depicted example, the set of anti-fuse cells includes four anti-fuse cells 104, 106, 108, and 110 (referred to as "anti-fuse cells 104-110"). However, the number of anti-fuse cells of the set can include more or fewer anti-fuse cells depending on implementation.

The fuse control module 102 (e.g., control logic) includes an input to receive program control signaling 111, an input to receive read control signaling 112, and a plurality of outputs to provide fuse control signaling 114, 116, 118, and 120 (hereinafter, "fuse control signaling 114-120") to the anti-fuse cells 104, 106, 108, and 110, respectively. The program control signaling 111 includes signaling to control the programming of the anti-fuse cells 104-110. In one embodiment, the program control signaling 111 is generated during fabrication or during configuration by a user in order to program certain anti-fuse cells 104-110 so as to alter a function of an operational component of the IC device which the anti-fuse array 110 is implemented, to reroute circuitry around a component identified as defective during testing, or to set the mode of the IC device. The read control signaling 112 includes signaling to control access to the states of the anti-fuse cells 104-110 during operation of the IC device so as to effect the intended trimming, rerouting, or mode setting operations. The fuse control signaling 114-120 can include one or more signals to control the operation of the corresponding anti-fuse cells 104-110 based on the program control signaling 111 and the read control signaling 112 as described herein.

Each of the anti-fuse cells 104-110 includes an anti-fuse 122, a shunt transistor 124, a shunt control module 126, and a fuse state module 128. Each of the anti-fuse cells 104-110 further can include a bias resistor 130 to control or limit current flow through the anti-fuse 122. Alternately, a current source may be used. The anti-fuse 122 is connected to a first voltage reference line (e.g., $V_{FUSE}$ line 121) via the bias resistor 130 and connected and a second voltage reference line (e.g., $V_{SS}$ line 123). The anti-fuse 122 can include any of a variety of types of anti-fuses, including poly-oxide-doped silicon or metal-oxide-metal anti-fuses, and the like. The shunt transistor 124 is connected in parallel with the anti-fuse 122 such that it forms an alternate current path in parallel to the current path that would be provided by the anti-fuse 122 in a programmed, or blown, state. The shunt transistor 124 can include any of a variety of transistor types, such as a field effect transistor (FET). In the illustrated example, the shunt transistor 124 includes an n-type transistor. The shunt control module 126 includes an input to receive the corresponding one of the fuse control signaling 114-120 and an output to provide shunt control signaling 132 to selectively enable or disable the shunt transistor 124 based on the received fuse control signaling. The fuse state module 128 is configured to determine a fuse state (e.g., programmed or not programmed) of the anti-fuse 122 and provide an indicator of the fuse state on a corresponding one of fuse state signaling 134, 136, 138, and 140 (hereinafter, "fuse state signaling 134-140"). As described in greater detail with reference to FIG. 2, in at least one embodiment the shunt control module 126 and the fuse state module 128 can be implemented in hardware as one or more logic gates.

During a program operation that occurs, for example, during fabrication or during configuration by a user or provider of the IC device, the fuse control module 102 receives program control signaling 111 that indicates which anti-fuses of the array are to be programmed. The fuse control module 102 configures the fuse control signaling 114-120 based on the received program control signaling 111 to carryout the indicated programming. For an anti-fuse cell intended to be programmed, the fuse control module 102 configures its corresponding fuse control signaling such that the shunt control module 126 of the anti-fuse cell disables its shunt transistor 124. After disabling the shunt transistor 124 of the anti-fuse cell to be programmed, a program voltage in excess of the oxide breakdown voltage of the anti-fuse 122 is applied to the $V_{FUSE}$ line 121 so as to "blow" or program the anti-fuse 122, thereby changing the anti-fuse 122 to a lower resistance state. To illustrate, a typical oxide breakdown voltage for an anti-fuse may be, for example, 3 Volts (V), and thus the program voltage ($V_{PROG}$) applied to the $V_{FUSE}$ line 121 so as to program an anti-fuse 122 can include, for example, 7.5 V. During normal operation (including reading the fuse state of the anti-fuse 122), the voltage ($V_{NORM}$) applied to the $V_{FUSE}$ line 121 is less than the oxide breakdown voltage and typically is the operating voltage, e.g., 1.5 V, of the component in which the anti-fuse 122 is implemented.

The relatively high program voltage and the relatively close proximity of the anti-fuses 122 of the anti-fuse array 100 can lead to the introduction of a current in the anti-fuses 122 that are proximate to an anti-fuse cell being programmed due to parasitic capacitance. Due to the relative thinness of the oxide layer typically implemented in anti-fuses, the introduction of this stray current can inadvertently blow the proximate anti-fuses 122 during the programming of another anti-fuse 122. To illustrate, without the proper precautions the programming of the anti-fuse 122 of the anti-fuse cell 106 may result in the unintended programming of the anti-fuses 122 of the anti-fuse cell 104 and the anti-fuse cell 108 due to their adjacency to the anti-fuse cell 106.

In order to reduce or eliminate inadvertent programming of proximate anti-fuse cells, the fuse control module 102, in one embodiment, configures the fuse control signaling so as to enable the shunt transistors 124 in anti-fuse cells proximate to an anti-fuse cell being programmed, thereby allowing any current introduced through parasitic capacitive coupling in the proximate anti-fuse cells to be shunted around the anti-fuses of the proximate anti-fuse cells. In one embodiment, each of a subset of anti-fuse cells is configured to shunt errant currents based on its proximity to an anti-fuse cell being programmed. To illustrate, assume that the anti-fuse cell 106 is being programmed. Due to the proximity of anti-fuse cells 104 and 108 to the anti-fuse cell 106, the fuse control module 102 can configure the fuse control signaling 114 and 118 so that the shunt transistor 124 of the anti-fuse cell 104 and the shunt transistor 124 of the anti-fuse cell 108 are enabled during the programming of the anti-fuse cell 106, thereby allowing any errant currents caused by the programming of the anti-fuse cell 106 to be shunted through the shunt transistors 124 of the anti-fuse cells 104 and 108. In another embodiment, all of the anti-fuse cells of the anti-fuse array 100 that are not being programmed during a program operation are configured to shunt errant currents during the program operation regardless of their proximity to an anti-fuse cell being programmed.

In addition to the stray current protection afforded by the use of the shunt transistors 124, the shunt transistors 124 also can be used as program selection circuitry to selectively program the anti-fuses 122 of the anti-fuse array 100. The shunt transistors 124 associated with the anti-fuses 122 to be programmed can be disabled during a program operation, thereby facilitating a program current through the corresponding anti-fuse 122. Conversely, the shunt transistors 124 associated with the anti-fuses 122 that are to remain unprogrammed can be enabled during the program operation, thereby shunting current around the corresponding anti-fuse 122 while the program voltage is being applied to the $V_{FUSE}$ line 121 common to each of the anti-fuse cells 104-110.

Figure 2:
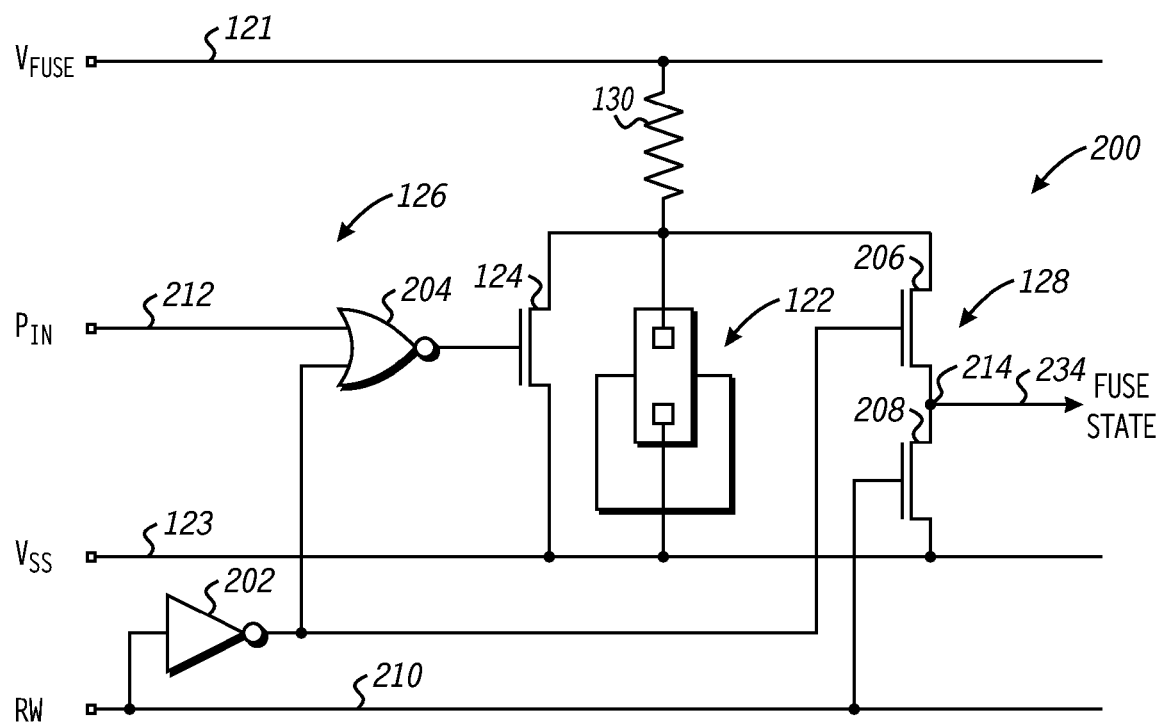
FIG. 2 is a circuit diagram illustrating an example anti-fuse cell in accordance with at least one embodiment of the present disclosure.

FIG. 2 illustrates an example implementation of an anti-fuse cell 200 in accordance with at least one embodiment of the present disclosure. The anti-fuse cell 200 corresponds to the anti-fuse cells 104-110 of FIG. 1.

The anti-fuse cell 200 includes the anti-fuse 122, the shunt transistor 124, the shunt control module 126, the fuse state module 128, and the bias resistor 130 described above with respect to FIG. 1. In the depicted example of FIG. 2, the shunt control module 126 includes an inverter 202 and a NOR gate 204 and the fuse state module 128 includes a transistor 206 and a transistor 208. Further, the fuse control signaling provided by control logic to the anti-fuse 122, such as the fuse control signaling 114-120 provided by the fuse control module 102 of FIG. 1) includes a read/write (RW) line 210 and a program in ($P_{IN}$) line 212. The RW line 210 serves to configure the anti-fuse cell 200 so that the state of the anti-fuse 122 can be determined via the fuse state module 128. The RW line 210 also serves in conjunction with the $P_{IN}$ line 212 to configure the anti-fuse cell 200 to program the anti-fuse 122.

The anti-fuse 122 includes a first electrode connected to the $V_{FUSE}$ line 121 via the bias resistor 130 and a second electrode connected to the $V_{SS}$ line 123. The shunt transistor 124 includes a first current electrode connected to the first electrode of the anti-fuse 122, a second current electrode connected to the $V_{SS}$ line 123, and a control electrode. The NOR gate 204 includes an input connected to the $P_{IN}$ line 212, an input connected to the RW line 210 via the inverter 202, and an output connected to the control electrode of the shunt transistor 124. The transistor 206 includes a first current electrode connected to the $V_{FUSE}$ line 121 via the bias resistor 130, a second current electrode connected to a node 214, and a control electrode connected to the RW line 210 via the inverter 202. The transistor 208 includes a first current electrode connected to the node 214, a second current electrode connected to the $V_{SS}$ line 123, and a control electrode connected to the RW line 210. The node 214, in turn, is connected to an output to provide fuse state signaling 234 (analogous to the fuse state signaling 134-140 of FIG. 1) representative of the fuse state (e.g., "blown" or "not blown") of the anti-fuse 122.

In at least one embodiment, the same RW line 210 is distributed to a plurality of anti-fuse cells 200, whereas the $P_{IN}$ line 212 is particular to a single anti-fuse cell 200 (or alternately, a subset of the plurality of anti-fuse cells). Thus, the RW line 210 can be used to select a block of anti-fuse cells 200 during a program operation, while each $P_{IN}$ line 212 for each anti-fuse cell 200 can be individually set so as to control which anti-fuse cells of the selected block of anti-fuse cells is programmed during the program operation.

For purposes of the illustrated example, it is assumed that the RW line 210 is driven to a low logic state (e.g., a logic "0") during a read operation to the anti-fuse cell 200 to determine the fuse state of the anti-fuse cell 200 and the RW line 210 is driven to a high logic state (e.g., a logic "1") during a program operation to the anti-fuse cell 200 to program, or blow, the anti-fuse 122. Similarly, it is also assumed that the $P_{IN}$ line 212 is driven to a logic high state during a program operation to the anti-fuse cell 200 and driven low (or tristated) during a read operation to the anti-fuse cell 200.

During a program operation to the anti-fuse cell 200, a program voltage $V_{PROG}$ sufficiently in excess of the oxide breakdown voltage of the anti-fuse 122 is applied to the $V_{FUSE}$ line 121. Prior to or concurrent with the application of the program voltage $V_{PROG}$, control logic (e.g., the fuse control module 102, FIG. 1) sets both the RW line 210 and the $P_{IN}$ line 212 to a logic "1". Accordingly, the output of the NOR gate 204 is driven to a logic "0", thereby causing the shunt transistor 124 to enter a substantially non-conductive state. Further, the logic "1" state of the RW line 210 causes the transistor 206 to enter a non-conductive state and the transistor 208 to enter a conductive state, thereby pulling the node 214 to $V_{SS}$ and effectively isolating any downstream circuitry connected to the node 214 from the program voltage $V_{PROG}$ applied at the $V_{FUSE}$ line 121.

As a result of the application of the program voltage $V_{PROG}$ and the configuration of the shunt transistor 124 into a non-conductive state, a voltage in excess of the oxide breakdown voltage is applied between the electrodes of the anti-fuse 122 via the bias resistor 130, thereby causing an oxide rupture of the anti-fuse 122 (i.e., thereby "blowing" the anti-fuse 122). The oxide breakdown of the anti-fuse 122 causes a substantial increase in the conductivity between the electrodes of the anti-fuse 122 such that the anti-fuse 122 changes from a substantially non-conductive state to a substantially conductive state. After the program operation has completed, the voltage on the $V_{FUSE}$ line 121 is returned to a lower operating voltage ($V_{NORM}$)

During a read operation to the anti-fuse cell 200, the RW line 210 is set to logic "0." As a result, the output of the NOR gate 204 is set to logic "0", thereby setting or maintaining the shunt transistor 124 in a non-conductive state. The logic "0" state of the RW line 210 causes the transistor 206 to enter a conductive state and causes the transistor 208 to enter a non-conductive state, thereby connecting the first electrode of the anti-fuse 122 to the node 214 via the transistor 206 and isolating the node 214 from the $V_{SS}$ line 123. Accordingly, the voltage at the node 214, and thus the voltage of the fuse state signaling 234, is substantially equal to the voltage difference between the electrodes of the anti-fuse 122. In the event that the anti-fuse 122 was previously blown, the conductivity between the electrodes of the anti-fuse 122 will be substantially high and thus the voltage level of the fuse state signaling 234 will be approximately equal to $V_{SS}$. Conversely, in the event that the anti-fuse 122 has not yet been blown, the conductivity between the electrodes of the anti-fuse 122 will be substantially low and thus the voltage level of the fuse state signaling 234 will be near the voltage of the $V_{FUSE}$ line 121 (e.g., $V_{NORM}$). Thus, in the illustrated embodiment, the fuse state of the anti-fuse 122 can be determined during the read operation based on the voltage level of the fuse state signaling 234.

During a program operation whereby the anti-fuse 122 is intended to remain unprogrammed, control logic sets the RW line 210 to a logic "1" and the control logic sets or maintains the $P_{IN}$ line 212 for the anti-fuse cell 200 that is not intended to be programmed to a logic "0." As a result, the output of the NOR gate 204 is set to a logic "1", thereby causing the shunt transistor 124 to enter a substantially conductive state. In this state, the shunt transistor 124 acts as a short in parallel with the anti-fuse 122 such that the application of the program voltage $V_{PROG}$ to the $V_{FUSE}$ line 121 results in a shunting of current away from the anti-fuse 122 and through the shunt transistor 124. Further, any errant currents generated at the anti-fuse cell 200 due to the write operation to the proximate anti-fuse cell will be shunted around the anti-fuse 122 through the shunt transistor 124, which reduces or eliminates inadvertent programming of the anti-fuse cell 200 while a proximate anti-fuse is being programmed.

Although FIG. 2 illustrates a particular implementation whereby the bias resistor 130 is utilized to control or limit the current applied to the anti-fuse 122 during a program operation, it will be appreciated that other techniques may be utilized to control the current during programming. For example, in an alternate embodiment, a current source can be utilized to induce a current through the anti-fuse 122 during programming.

Figure 3:
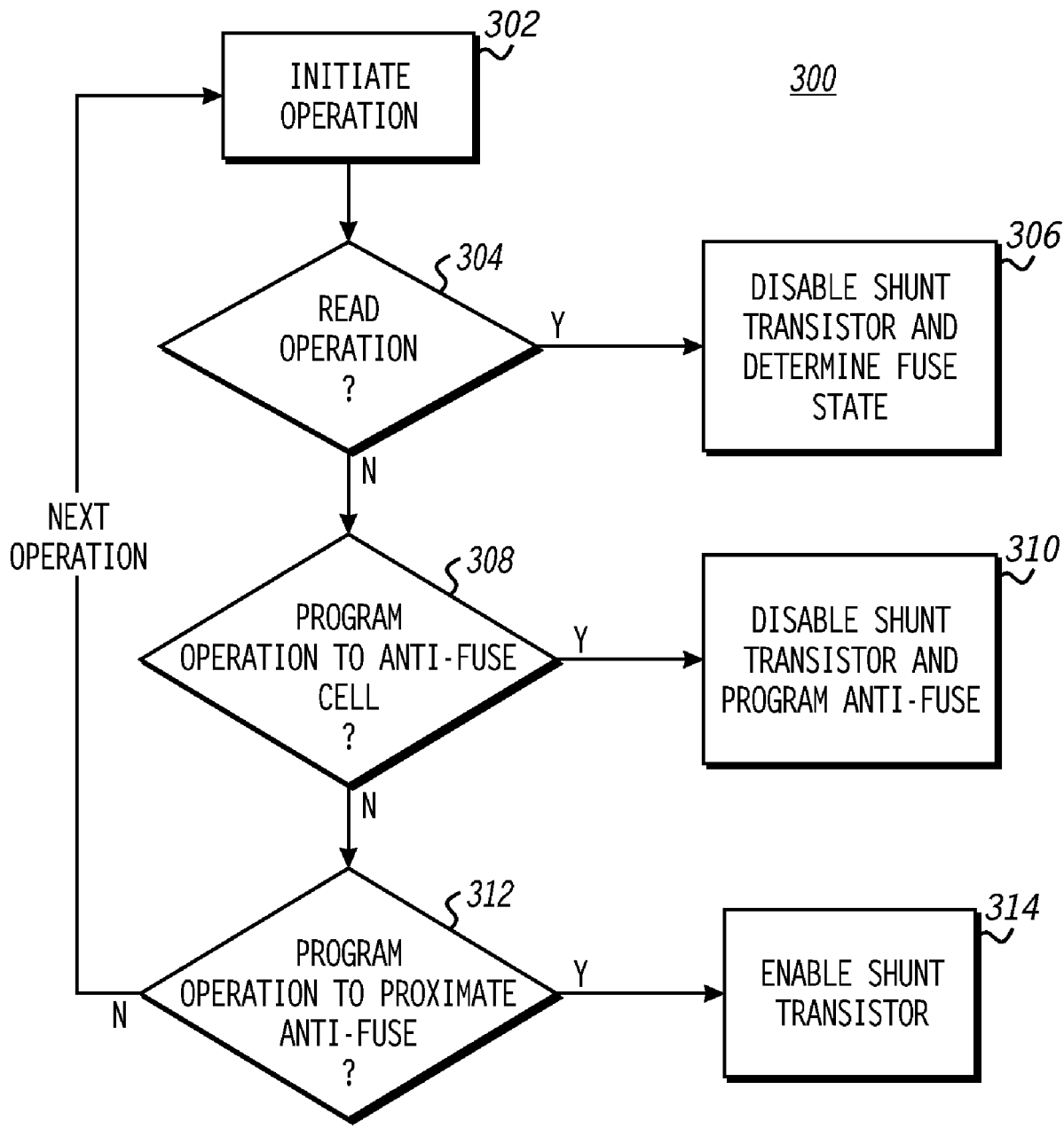
FIG. 3 is a flow diagram illustrating a method for programming an anti-fuse cell in accordance with at least one embodiment of the present disclosure.

FIG. 3 illustrates an example method 300 for configuring an anti-fuse cell having a shunt transistor (e.g., anti-fuse cell 200, FIG. 2) during various anti-fuse operations in accordance with at least one embodiment of the present disclosure. At block 302, an anti-fuse operation is initiated for an anti-fuse array. At block 304, an anti-fuse cell of the anti-fuse array determines whether the anti-fuse operation is a read operation via, for example, the state of its RW line 210 (FIG. 2). In the event of a read operation, at block 306 the anti-fuse cell disables its shunt resistor (i.e., configures the shunt resistor to have a substantially non-conductive state) and outputs a voltage or other characteristic representative of the fuse state of its anti-fuse as described above.

At block 308, the anti-fuse cell determines whether the anti-fuse operation is a write operation to the anti-fuse cell via, for example, the states of its RW line 210 and its PIN line 212 (FIG. 2). In the event of a write operation to the anti-fuse cell, at block 310 the anti-fuse cell disables its shunt transistor so as to allow its anti-fuse to be programmed as described above.

At block 312, the anti-fuse cell determines whether the anti-fuse operation is a write operation to a different anti-fuse in the anti-fuse array. In the event of a write operation to a different anti-fuse, at block 314 the anti-fuse enables its shunt transistor so as to form a short around its anti-fuse to protect against errant currents caused by parasitic capacitance coupling or other phenomena during the programming of the other anti-fuse. Otherwise, the next anti-fuse operation can be initiated and the process represented by blocks 302, 304, 306, 308, 310, 312, and 314 can be repeated for the next anti-fuse operation.

In one embodiment, the shunt transistor of the anti-fuse is selectively enabled based on a proximity of the anti-fuse to the other anti-fuse being programmed. To illustrate, the shunt transistors of only those anti-fuses that are adjacent or are with a predetermined distance from the anti-fuse being programmed may be enabled, whereas the shunt-transistors of other anti-fuses that are outside of the predetermined distance may remain disabled. Alternately, the shunt transistors of all of the anti-fuse cells that are not being programmed may be enabled. Further, in one embodiment, the shunt transistors of all of the anti-fuse cells may be enabled by default unless a program operation or a read operation is occurring to the anti-fuse cell itself. Accordingly, the process of performing the program operation can include identifying those anti-fuse cells that are proximate (e.g., adjacent, within a predetermined distance, or are within a predetermined logical arrangement) to the anti-fuse cell being programmed and then selectively enabling the shunt transistors of the identified proximate anti-fuse cells.

Figure 4:
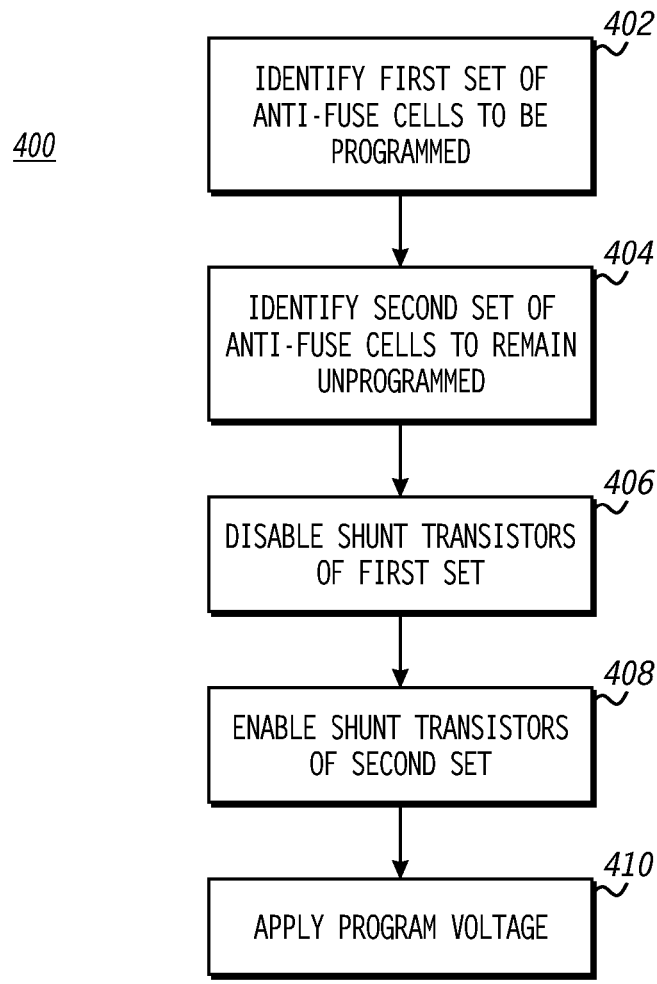
FIG. 4 is a flow diagram illustrating a method for selectively programming anti-fuse cells using selective activation of parallel shunt transistors in accordance with at least one embodiment of the present disclosure.

FIG. 4 illustrates an example method 400 for selectively programming anti-fuses of an anti-fuse array by selectively enabling and disabling shunt transistors in parallel with the anti-fuses of the anti-fuse array in accordance with at least one embodiment of the present disclosure. For the following description, it is assumed that the anti-fuse array comprises an array of anti-fuses cells corresponding to the example anti-fuses cells of FIGS. 1 and 2.

At block 402, a program operation is initiated and a first set of anti-fuse cells of the anti-fuse array for which the program operation is intended are identified and at block 404 a second set of anti-fuse cells of the anti-fuse array for which the program operation is not intended is identified. Each anti-fuse cell of the anti-fuse array can be identified as intended to be programmed or intended to remain unprogrammed based on, for example, programming control signaling 111 (FIG. 1) from another device.

At block 406, control logic disables the shunt transistors of the first set of anti-fuse cells and at block 408 control logic enables the shunt transistors of the second set of anti-fuse cells. At block 410, a program voltage $V_{PROG}$ (or alternately, a program current) is applied between the two voltage reference lines to which each anti-fuse cell is connected. During the application of the program voltage $V_{PROG}$, program currents are formed through the anti-fuses of the anti-fuse cells of the first set because the corresponding shunt transistors have been disabled and thus act as open circuits. In contrast, during the application of the program voltage $V_{PROG}$, the voltage reference lines are shorted together via the enabled shunt transistors of the anti-fuse cells of the second set, thereby preventing the formation of programming currents through the anti-fuses of the anti-fuse cells of the second set while the program voltage $V_{PROG}$ is being applied.

Figure 5:
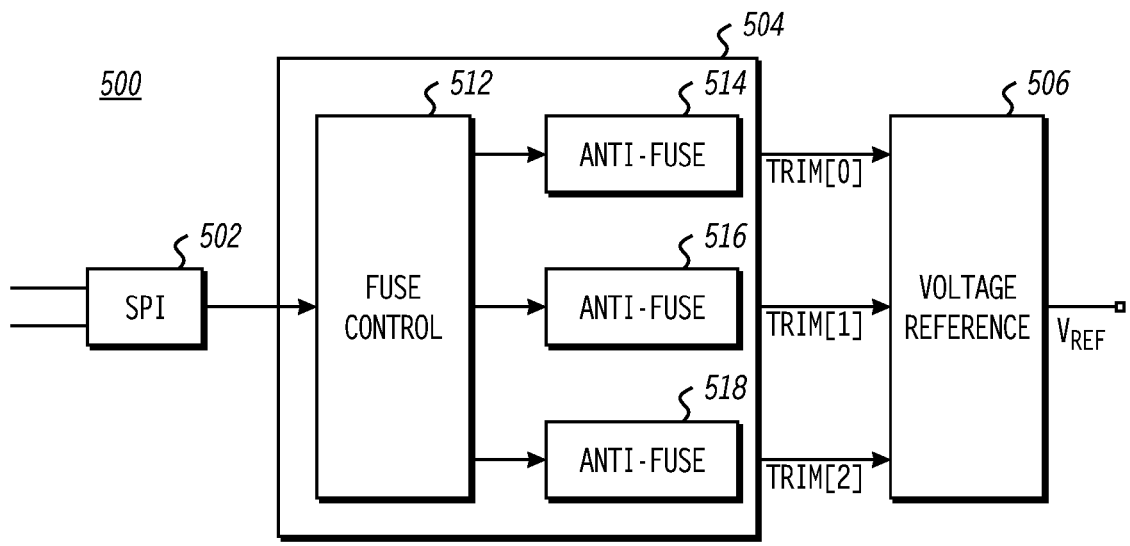
FIG. 5 is a block diagram illustrating an example implementation of an anti-fuse array in accordance with at least one embodiment of the present disclosure.

FIG. 5 illustrates an example implementation of a system 500 utilizing an anti-fuse shunting technique in accordance with at least one embodiment of the present disclosure. In the illustrated example, the system 500 includes a serial/parallel interface (SPI) 502, a fuse box 504, and an operational component coupled to the fuse box 504, such as a voltage reference module 506. The fuse box 504 includes a fuse control module 512 (analogous to the fuse control module 102, FIG. 1) and three anti-fuse cells 514, 516, and 518 (hereinafter, "anti-fuse cells 514-518"), whereby each of the anti-fuse cells 514-518 includes an anti-fuse and a shunt transistor connected in parallel as described above. A bit value (e.g., voltage level) controlled by the fuse state of the anti-fuse of each of the anti-fuse cells 514-518 is used as a trim input Trim[0:2] used to trim a voltage $V_{REF}$ output by the voltage reference module 506. In the illustrated example, the value of the bit Trim[0] is based on the fuse state of the anti-fuse cell 514, the value of the bit Trim[1] is based on the fuse state of the anti-fuse 516, and the value of the bit Trim[2] is based on the fuse state of the anti-fuse 518.

In at least one embodiment, control information can be received via the SPI 502 so as to direct the programming of some or all of the anti-fuse cells 514-518 to provide a value for Trim[0:2] that achieves a predetermined trimming of the voltage $V_{REF}$. As described in detail above, the fuse control module 512 can control the anti-fuse cells 514-518 during programming such that the shunt transistors of the anti-fuse cells being programmed are disabled to permit programming while the shunt transistors of the anti-fuse cells that are to remain unprogrammed are enabled so as to shunt any errant currents away from the associated anti-fuses. This selective enabling of the shunt transistors protects the anti-fuse cells intended to be unprogrammed from being inadvertently programmed. Likewise, the fuse control module 512 can control the anti-fuse cells 514-518 during a read operation to obtain the Trim[0:2] value such that the shunt transistors are disabled so as avoid interfering with the determination of the fuse states of the anti-fuse cells 514-518.

Although FIG. 5 illustrates a particular implementation of anti-fuse cells having a parallel-connected shunt transistor, the anti-fuse cells may be used in other implementations to configure the operations of other types of operational components without departing from the scope of the present disclosure. For example, one or more anti-fuse cells can be used to set a particular mode of operation, to enable or disable certain circuitry, to reroute around failed circuitry, and the like.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
   disabling a first shunt transistor coupled in parallel with a first anti-fuse in response to initiation of a first program operation intended for the first anti-fuse;
   enabling the first shunt transistor in response to initiation of a second program operation not intended for the first anti-fuse;
   disabling a second shunt transistor coupled in parallel with a second anti-fuse in response to initiation of the second program operation, the second program operation intended for the second anti-fuse; and
   enabling the second shunt transistor in response to initiation of the first program operation, the first program operation not intended for the second anti-fuse.

2. The method of claim 1, wherein disabling the first shunt transistor comprises selectively disabling the first shunt transistor based on a proximity of the second anti-fuse to the first anti-fuse.

3. The method of claim 1, further comprising:
   disabling the first shunt transistor in response to initiation of a read operation for the first anti-fuse.

4. The method of claim 3, further comprising:
   determining, during the read operation, a fuse state of the first anti-fuse based on a voltage difference between electrodes of the first anti-fuse.

5. The method of claim 4, further comprising:
   controlling an operation of a component based on the fuse state.

6. The method of claim 1, further comprising:
   applying a program voltage to the first anti-fuse to program the first anti-fuse during the first program operation.

7. A device comprising:
   a first anti-fuse comprising a first electrode coupleable to a first voltage reference and a second electrode coupleable to a second voltage reference;
   a first shunt transistor comprising a first current electrode coupled to the first electrode of the first anti-fuse, a second current electrode coupled to the second electrode of the first anti-fuse, and a control electrode;
   first control logic configured to disable the first shunt transistor in response to a first program operation intended for the first anti-fuse;
   a second anti-fuse comprising a first electrode coupleable to the first voltage reference and a second electrode coupleable to the second voltage reference;
   a second shunt transistor comprising a first current electrode coupled to the first electrode of the second anti-fuse, a second current electrode coupled to the second electrode of the second anti-fuse, and a control electrode; and
   second control logic configured to enable the second shunt transistor in response to the first program operation.

8. The device of claim 7, wherein the first control logic is configured to enable the first shunt transistor in response to a second program operation not intended for the first anti-fuse.

9. The device of claim 7, wherein the first control logic is configured to disable the first shunt transistor in response to a read operation for the first anti-fuse.

10. The device of claim 9, further comprising:
    a fuse state module configured to determine a voltage difference between the first electrode and the second electrode of the first anti-fuse during the read operation.

11. The device of claim 10, wherein the fuse state module comprises:
    an output to provide a voltage representative of the voltage difference;
    a first transistor comprising a first electrode coupled to the first voltage reference, a second electrode coupled to the output, and a control electrode to receive a first control signal, wherein the first transistor is enabled when the first control signal is in a first state and disabled when the first control signal is in a second state; and
    a second transistor comprising a first electrode connected to the output, a second current electrode connected to the second voltage reference, and a control electrode to receive a second control signal, wherein the second control signal is an inverse of the first control signal and wherein the second transistor is enabled when the second control signal is in the first state and disabled when the second control signal is in the second state.

12. The device of claim 7, wherein the second control logic is configured to disable the second shunt transistor in response to a second program operation intended for the second anti-fuse.

13. The device of claim 12, wherein the first control logic is configured to enable the first shunt transistor in response to the second program operation.

14. A device comprising:
    an array of anti-fuse cells, each anti-fuse cell comprising an anti-fuse and a shunt transistor coupled in parallel; and
    a fuse control module configured to:
       disable a first shunt transistor of a first anti-fuse cell of the array in response to a first program operation; and
       enable a second shunt transistor of a second anti-fuse cell of the array in response to the first program operation, the first program operation intended for the first anti-fuse cell and not intended for the second anti-fuse cell.

15. The device of claim 14, wherein the fuse control module is configured to:
   disable the second shunt transistor in response to a second program operation; and
   enable the first shunt transistor in response to the second program operation, the second program operation intended for the second anti-fuse cell and not intended for the first anti-fuse cell.

16. The device of claim 14, wherein the fuse control module is configured to:
   disable the first shunt transistor in response to a read operation for the anti-fuse of the first anti-fuse cell; and
   disable the second shunt transistor in response to a read operation for the anti-fuse of the second anti-fuse cell.

17. The device of claim 14, further comprising:
   a fuse state module coupled to the first anti-fuse cell and configured to determine a fuse state of the anti-fuse of the first anti-fuse cell.

18. The device of claim 17, further comprising:
   an operational component coupled to the first anti-fuse cell and configurable based on the fuse state of the anti-fuse of the first anti-fuse cell.

* * * * *